(12) United States Patent
Ku et al.

(10) Patent No.: US 7,676,686 B2
(45) Date of Patent: Mar. 9, 2010

(54) DELAY LOCKED LOOP CIRCUIT AND SYNCHRONOUS MEMORY DEVICE INCLUDING THE SAME

(75) Inventors: Young-Jun Ku, Kyoungki-do (KR); Ji-Eun Jang, Kyoungki-do (KR)

(73) Assignee: Hynix Semiconductor, Inc., Gyeonggi-do (KR)

(*) Notice: Subject to any disclaimer, the term of this patent is extended or adjusted under 35 U.S.C. 154(b) by 841 days.

(21) Appl. No.: 11/477,541

(22) Filed: Jun. 30, 2006

(65) Prior Publication Data

US 2007/0069775 A1    Mar. 29, 2007

(30) Foreign Application Priority Data

Sep. 29, 2005  (KR) .................. 10-2005-0091555
Dec. 2, 2005   (KR) .................. 10-2005-0117124

(51) Int. Cl.
   *G06F 1/04*    (2006.01)
   *H03L 7/06*    (2006.01)

(52) U.S. Cl. ...................... 713/600; 327/158

(58) Field of Classification Search ............... 713/500, 713/600; 711/160; 327/158
See application file for complete search history.

(56) References Cited

U.S. PATENT DOCUMENTS

| | | | |
|---|---|---|---|
| 6,150,861 A * | 11/2000 | Matsunaga et al. | 327/203 |
| 6,259,288 B1 | 7/2001 | Nishimura | |
| 6,525,988 B2 * | 2/2003 | Ryu et al. | 365/194 |
| 6,535,989 B1 * | 3/2003 | Dvorak et al. | 713/500 |
| 6,650,594 B1 | 11/2003 | Lee et al. | |
| 6,678,206 B2 | 1/2004 | Chu et al. | |
| 6,768,690 B2 | 7/2004 | Kwon et al. | |
| 6,825,703 B1 | 11/2004 | Kwak | |
| 6,836,437 B2 | 12/2004 | Li et al. | |
| 6,859,413 B2 | 2/2005 | Phan et al. | |
| 6,988,218 B2 * | 1/2006 | Drexler | 713/600 |
| 2004/0042282 A1 | 3/2004 | Li et al. | |
| 2005/0060487 A1 | 3/2005 | Barth et al. | |
| 2005/0093599 A1 | 5/2005 | Kwak | |
| 2006/0221759 A1 * | 10/2006 | Smith et al. | 365/233 |

FOREIGN PATENT DOCUMENTS

JP    11-185470 A    7/1999
JP    2005-20686 A   1/2005

(Continued)

OTHER PUBLICATIONS

Korean Office Action issued in corresponding Korean Patent Application No. KR 10-2005-0117124, dated Oct. 24, 2006.
English Translation of Taiwanese Search Report issued in Taiwanese Patent Application No. 095123986 dated on May 7, 2008.

(Continued)

*Primary Examiner*—Chun Cao
(74) *Attorney, Agent, or Firm*—IP & T Law Firm PLC

(57) ABSTRACT

A delay locked loop (DLL) circuit for a synchronous dynamic random access memory (SDRAM) enables a more stable operation when the semiconductor operates in a power-down mode for low power. The present invention can prevent a phase update operation from being interrupted when the DLL circuit enters a power-down mode. For the above purpose, an off operation of a clock buffer is delayed until a clock signal notifying a final period of the phase update is activated.

13 Claims, 3 Drawing Sheets

FOREIGN PATENT DOCUMENTS

| | | |
|---|---|---|
| KR | 1999-53733 | 7/1999 |
| TW | 508593 | 11/2002 |
| TW | 577087 | 2/2004 |

OTHER PUBLICATIONS

English Translation of Taiwanese Office Action issued in Taiwanese Patent Application No. 095123986 dated on May 7, 2008.

* cited by examiner

DELAY LOCKED LOOP CIRCUIT AND SYNCHRONOUS MEMORY DEVICE INCLUDING THE SAME

FIELD OF THE INVENTION

The present invention relates to semiconductor design technologies; and more particularly, to a delay locked loop (DLL) for a synchronous dynamic random access memory (SDRAM), which enables a more stable operation when the semiconductor operates in a power-down mode for low power.

DESCRIPTION OF RELATED ARTS

A synchronous semiconductor memory device such as double data rate (DDR) SDRAM performs data transmission with external devices by using an internal clock signal that is locked in synchronism with an external clock signal from an external device such as a memory controller. This is because temporal synchronization between a reference clock signal and data is very important for stable data transmission between the memory and the memory controller. In other words, for stable data transmission, data should be correctly arranged at the edge or center of a clock by reverse-compensating a time taken to carry the data on a bus from the clock of respective elements that transmit the data. Clock synchronization circuits for this purpose include a phase locked loop (PLL) circuit and a DLL circuit. For example, if a frequency of an external clock signal is different from that of an internal clock signal, the PLL circuit is mainly employed due to a need for a multiple frequency function. Otherwise, if a frequency of the external clock signal is identical to that of the internal clock signal, the DLL circuit is mostly utilized.

The DLL circuit creates an internal clock signal through compensation for clock delay components that occur during the course of conveying an output clock signal to a data output stage within a semiconductor memory device and thus allows the clock signal used for input/output of final data to be synchronized with an external clock signal. In this DLL circuit, advantages are that noise is minimal and small-sized circuit implementation is possible, compared to the PLL circuit. Because of such merits, the DLL circuit is generally adopted in the semiconductor memory device as the synchronization circuit. A widely used DLL circuits a register controlled DLL circuit, provided with a register that can store a locked delay value, and which keeps the value in the register when power is interrupted. Time needed for an initial clock locking is reduced by loading the locked delay value stored in the register for use when power is resumed for the clock locking.

FIG. 1 is a block diagram of a conventional DLL circuit.

As shown therein, the conventional DLL circuit generally includes a clock buffer controller 10, a clock buffer 20, first and second phase delay & delay controllers 30 and 40, a pre-duty cycle correction (DCC) unit 50, a DCC unit 60, a delay replica modeling unit 70, a phase comparator 80, a mode generator 90, a DLL controller 100, A clock generator 110, and an output driver 120.

Specifically, the clock buffer controller 10 receives an inverted signal CKEB_COM of a clock enable signal, a signal SAPD having power-down mode information of mode register setting (MRS) and a signal RASIDLE with precharge information, and produces a clock buffer enable signal CLKBUF_ENB to control the clock buffer 20. For low power operation, the DRAM enters the power-down mode in response to the clock enable signal CKE of logic low value when no read/write operations are made therein. At this time, the clock buffer 20 generates no internal clock signals, thus turning the power off for current status storage by the DLL circuit.

The clock buffer 20, in response to the clock buffer enable signal CLKBUF-ENB, receives and buffers an external clock signal, and outputs first and second internal clock signals CLKIN1 and CLKIN2 of in-phase, a reference internal clock signal REFCLK and a third internal clock signal CONTCLK.

The first phase delay & delay controller 30 delays a phase of the first internal clock signal CLKIN1 and outputs a delayed signal as a first internal delay clock signal MIXOUT_R, in response to first and second locked state signals FAST_MODE_END and LOCK_STATE provided from the mode generator 90.

Similarly, the second phase delay & delay controller 40 delays a phase of the second internal clock signal CLKIN2 and provides a delayed signal as a second internal delay clock signal MIXOUT_F, in response to third and fourth locked state signals FAST_MODE_ENDF and LOCK_STATEF from the mode generator 90.

The pre-DCC unit 50 buffers the first internal delay clock signal MIXOUT_R and outputs it as a rising clock RCLK; and also buffers and inverts the second internal delay clock signal MIXOUT_F, and outputs an inverted signal as a falling clock FCLK. Here, duties of the rising clock RCLK and the falling clock FCLK are complementary in value. That is, if a high pulse width of the external clock is wide, a high pulse width of the rising clock RCLK is wide, while a high pulse width of the falling clock FCLK is narrow.

The DCC unit 60 accepts the rising clock RCLK and the falling clock FCLK of which clock duties are complementary, and corrects the duty of each clock to provide them as a rising feedback clock IFBCLKR and a falling feedback clock IFBCLKF.

The delay replica modeling unit 70 models the rising feedback clock IFBCLKR and the falling feedback clock IFBCLKF from the DCC unit 60 to compensate for delay factors that occur before signals arrive at the phase delay section after receipt of clock from the exterior of chip and until dispatching an output clock of the phase delay section to the exterior of chip. Through such modeling, a compensated rising feedback clock IFBCLKR and a compensated falling feedback clock FBCLKF, which compensate for a time difference between the external clock and the actual internal clock, are derived. The correct delay factors are used to determine a distorted value as a performance of the DLL circuit. For the delay replica modeling unit 70, there are methods of shrinking, simplifying, and using basic circuits as they are. In fact, the delay replica modeling unit 70 beforehand models the clock buffer, a DLL clock driver, an R/F divider, and an output buffer as it is.

The phase comparator 80 compares each of the compensated rising feedback clock FBCLKR and the compensated falling feedback clock FBCLKF from the delay replica modeling unit 70 with the reference internal clock signal REFCLK from the clock buffer 20 to produce phase detection signals. Normally, the external clock is divided by a divider for the comparison so that power consumption of the DLL circuit can be reduced.

The mode generator 90 generates the first and second locked state signals FAST_MODE_END and LOCK_STATE, indicating that a delay locking of the clock in the first phase delay & delay controller 30 has been established, by using a first location comparison control signal FINE, a first coarse delay control signal FM_PDOUT and a first fine delay control signal COARSE, provided from the phase comparator

80. Also, it produces the third and fourth locked state signals FAST_MODE_ENDF and LOCK_STATEF, denoting that a delay locking of clock in the second phase delay & delay controller 40 has been made, based on a second location comparison control signal FINEF, a second coarse delay control signal FM_PDOUTF and a second fine delay control signal COARSEF from the phase comparator 80.

The speed of phase update by the DLL circuit is varied depending on output logical values of the first to fourth locked state signals output from the mode generator 90. The phase update implies that a phase of each of the rising feedback clock FBCLKR and the falling feedback clock FBCLKF compensated by the DLL circuit is compared with that of the reference internal clock signal REFCLK to be decided, to continuously track a phase difference therebetween. Examples are introduced below.

If the phase difference between each of the compensated rising feedback clock FBCLKR and falling feedback clock FBCLKF and the reference internal clock signal REFCLK is large, the first and third locked state signals FAST_MODE_END and FAST_MODE_ENDF are kept at a logic low value. Then, the first and second phase delay & delay controllers 30 and 40, which receive the signals, shift the phases of the compensated rising feedback clock FBCLKR and falling feedback clock FBCLKF by a four-unit delay at a time, respectively. If the phase difference is less than the four-unit delay, the first and third locked state signals FAST_MODE_END and FAST_MODE_ENDF are maintained at a logic high value. The first and second phase delay & delay controllers 30 and 40 shift the phases of the compensated rising feedback clock FBCLKR and falling feedback clock FBCLKF by a two-unit delay at a time, respectively. If the phase difference is smaller than a one-unit delay, the first and second phase delay & delay controllers 30 and 40 fine-tune the phases of the feedback signals while the second and fourth locked state signals LOCK_STATE and LOCK_STATEF rise from a logic low to a logic high. After that, if the phases become in-phase, the DCC unit 60 is enabled by a phase update locking information signal DCC_ENB generated by itself and the phase update process is completed. In this process, the compensated rising feedback clock FBCLKR and falling feedback clock FBCLKF are controlled in different manner but in the same manner after the phase update has been locked.

The DLL controller 100 provides a reset signal RESET to control the operation of the DLL circuit in response to a DLL reset signal DLL_RESETB and a DLL inactivation signal DIS_DLL transmitted from the exterior of the memory.

The clock generator 110 receives the third internal clock signal CONTCLK from the clock buffer 20 and the phase update locking information signal DCC_ENB from the DCC UNIT 60 and generates a first clock PULSE2 indicating a start of a phase update period at the time of transitioning from the power-down mode and a second clock PULSE8_11 indicating an end thereof.

The output driver 120 buffers and outputs the rising feedback clock IFBCLKR and falling feedback clock IFBCLKF from the DCC unit 60.

In the DLL circuit having the structure as shown in FIG. 1, in case where the DLL circuit slowly escapes from the power-down mode, it is turned off at the time of entering into a precharge power-down mode. Thus, the internal clock of the DLL circuit becomes on/off by controlling on/off operations of the clock buffer 20. If the internal clock of the DLL circuit turns off, internal operation of the DLL circuit is temporarily halted and then resumed after leaving the precharge power-down mode. In this case, the following problems can occur.

Firstly, there may be a case in which a phase of the phase delay section is updated by using data, which is compared prior to entering into the precharge power-down mode according to the precharge power-down mode entry timing, after termination of the precharge power-down mode.

Secondly, the phase update may be conducted with wrong information, which is issued by a faster input of the reference internal clock signal REFCLK to the phase comparator 80, rather than simultaneous input of the internal clock signal and the compensated rising feedback clock FBCLKR and falling feedback clock FBCLKF thereto, for the reason that the internal clock of the DLL circuit comes on after termination of the precharge power-down mode.

SUMMARY OF THE INVENTION

It is, therefore, an object of the present invention to provide a DLL device and a method for a semiconductor memory device which allows a clock buffer of a DLL circuit to be turned off after an ongoing phase update is completed when the DLL enters a power-down mode entry in a normal mode where the phase update is being performed.

In accordance with one aspect of the present invention, there is provided a synchronous memory device having a normal mode and a power-down mode including: a DLL for generating a DLL clock based on locking information frozen at the time of termination of the power-down mode, wherein a phase update is not performed during the power-down mode; a clock generator for producing clocks indicating a start and an end of a phase update period during the normal mode; and a control unit for halting the phase update operation of the DLL after the clock indicating the end of the phase update period is input to have a margin of a phase update time when entering into the power-down mode from the normal mode.

In accordance with another aspect of the present invention, there is provided a DLL circuit including: a power-down mode controller for generating a first control signal to determine whether the DLL circuit enters or leaves a power-down mode; a clock generator for producing a first clock indicating a start of a phase update period and a second clock indicating an end of the phase update period; a clock buffer controller for receiving the first control signal and generating a second control signal in response to toggling of the second clock; a clock buffer for buffering an external clock and generating an internal clock in response to the second control signal; a phase update section for performing the phase update based on the internal clock; and a DLL controller for generating a reset signal to control the operation of DLL the circuit in response to a DLL reset signal and a DLL inactivation signal transmitted from the exterior of the memory.

The present invention can prevent an ongoing phase update operation from being abruptly interrupted by delaying an off time of a clock buffer to allow the clock buffer to be turned off after the phase update is completed when the DLL enters a power-down mode entry in a normal mode where the phase update is being performed. For the above purpose, the present invention employs an effective scheme that uses a final signal PULSE8_11 of a phase update period and delays an off time of the clock buffer until the final signal is activated, and is implemented in the clock buffer controller.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a delay locked loop (DLL) circuit in accordance with the present invention will be set forth in detail with reference to the accompanying drawings so that the invention can be readily carried out by those in the art to which the invention pertains.

Figure 1:
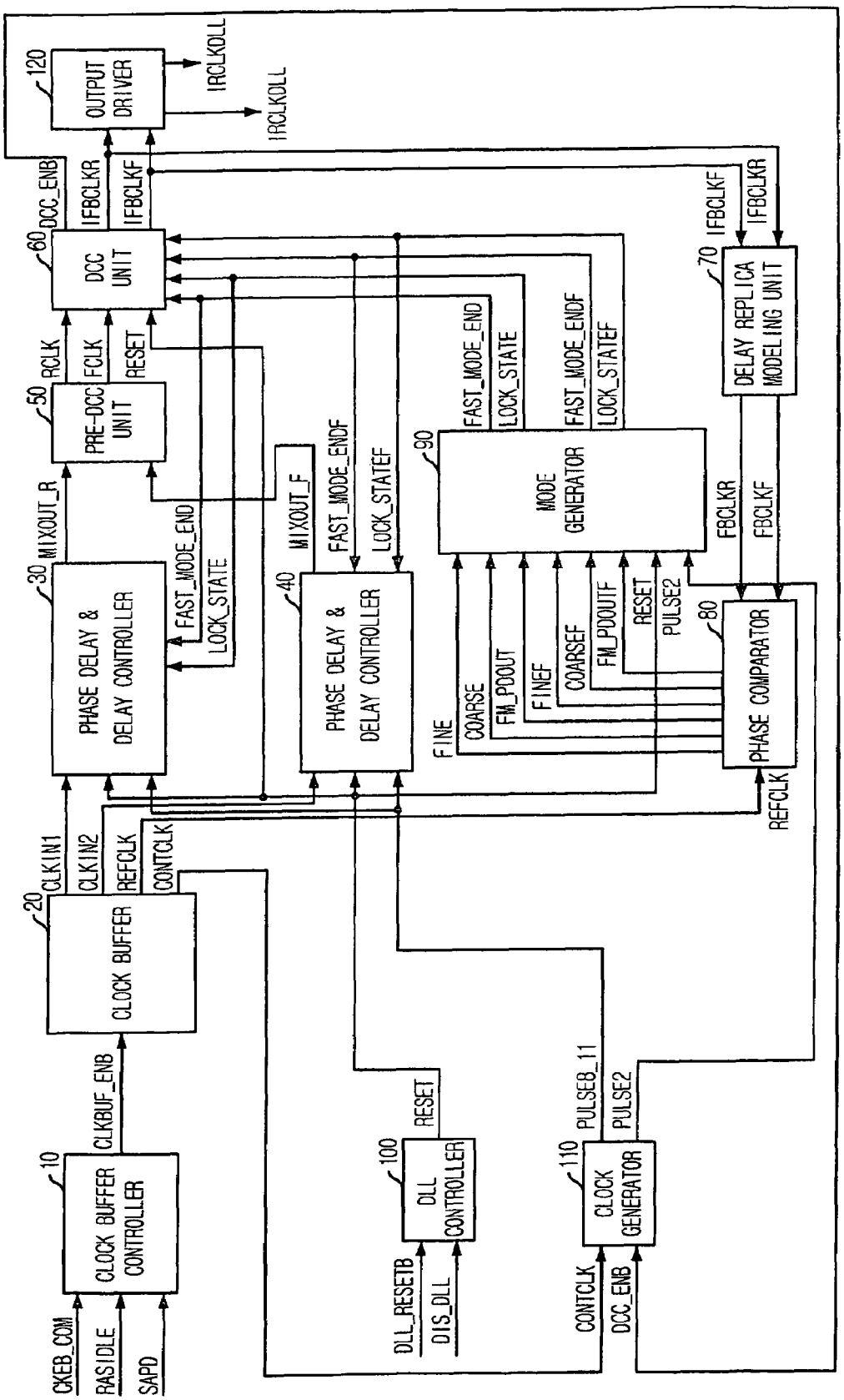
FIG. 1 is a block diagram of a configuration of a conventional DLL circuit.
Figure 2:
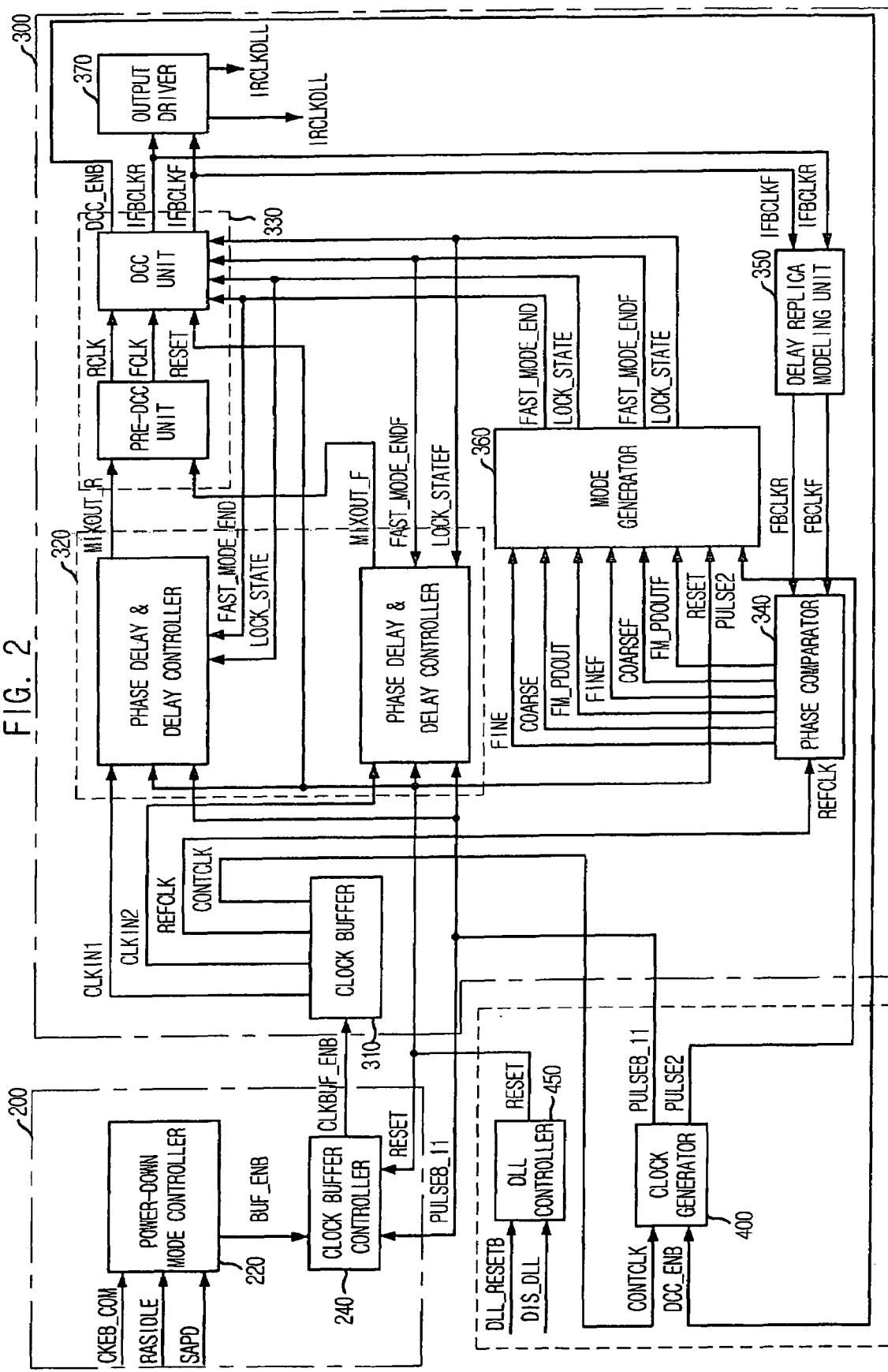
FIG. 2 is a block diagram of a configuration of a DLL circuit in accordance with an embodiment of the present invention.

FIG. 2 is a block diagram of a configuration of a DLL circuit in accordance with an embodiment of the present invention.

Referring to FIG. 2, the inventive DLL circuit has a normal mode and a power-down mode for use in a synchronous memory device. A DLL 300 generates a DLL clock based on locking information frozen at the time of termination of the power-down mode, wherein phase update is not performed during the power-down mode. A clock generator 400 generates clocks PULSE2 and PULSE8_11, indicating a start and an end of a phase update period during the normal mode. A control unit 200 for halts the phase update operation of the DLL 300 after the clock PULSE8_11, indicating the end of the phase update period is input, to provide a margin of phase update time when entering into the power-down mode from the normal mode.

More specifically, the control unit 200 is composed of a power-down mode controller 220 for generating a first control signal BUF_ENB to decide whether the power-down mode is entered or terminated and a clock buffer controller 240 for receiving the first control signal BUF_ENB and providing a second control signal CLKBUF_ENB in response to toggling of the second clock PULSE8_11.

The DLL 300 is provided with a clock buffer 310 that buffers an external clock and generates an internal clock REFCLK in response to the second control signal CLKBUF_ENB, and phase update circuits 320 to 370 for performing the phase update operation based on the internal clock REFCLK.

Figure 3:
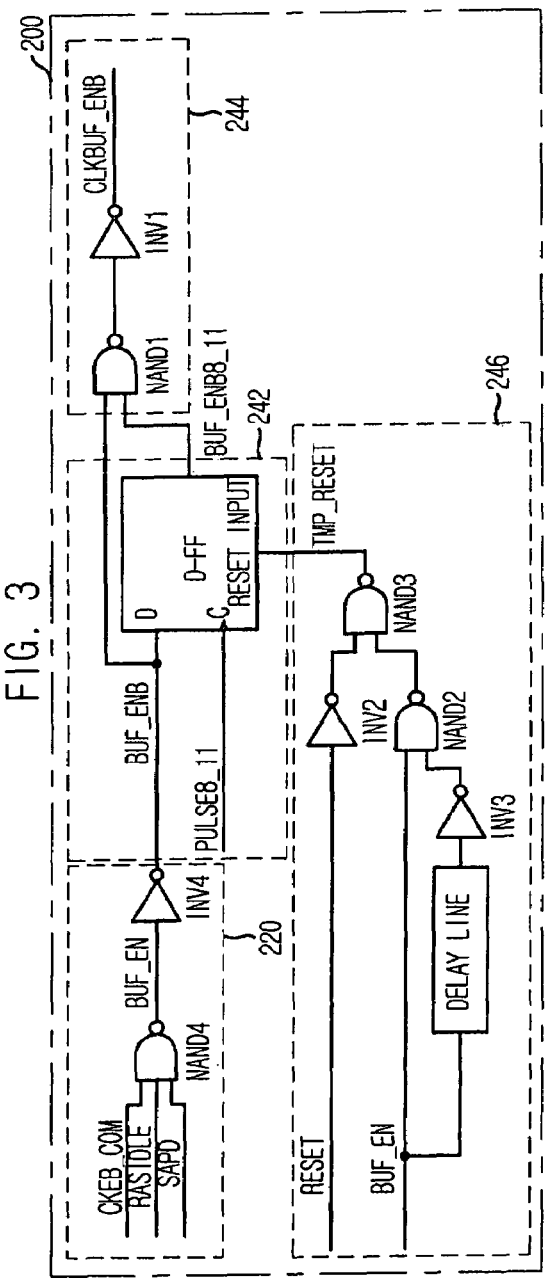
FIG. 3 is a schematic circuit diagram of a power-down mode controller and a clock buffer controller in accordance with an embodiment of the present invention.

FIG. 3 is a schematic circuit diagram of the power-down mode controller 220 and the clock buffer controller 240 in accordance with an embodiment of the present invention.

Referring to FIG. 3, the clock buffer controller 240 includes a signal delay circuit 242 for receiving the first control signal BUF_ENB and providing a signal that is generated by delaying the first control signal BUF_ENB by a predetermined time period in response to toggling of the second clock PULSE8_11, a logic circuit 244 for taking an output signal BUF_ENB8_11 of the signal delay circuit 242 and the first control signal BUF_ENB and generating the second control signal CLKBUF_ENB, and a reset circuit 246 for receiving the reset signal RESET and an inverted signal BUF_EN of the first control signal and controlling an operation of the signal delay circuit 242.

Among the components of the clock buffer controller 240, the signal delay circuit 242 is provided with a D Flip/Flop (F/F) in which the first control signal BUF_ENB is input to a data input D, the second clock PULSE8_11 to a clock input C, and the output signal of the reset circuit to a reset input. The D F/F is composed of a plurality of D F/Fs connected in series although not shown in the figure. The logic circuit 244 includes a first NAND gate NAND1 for receiving and NAND-operating the output signal BUF_ENB8_11 of the signal delay circuit 242 and the first control signal BUF_ENB to output a NAND-operated signal, and a first inverter INV1 for inverting the output signal of the first NAND gate NAND1 to provide the second control signal CLKBUF_ENB.

The reset circuit 246 includes a second inverter INV2 for inverting and outputting the reset signal RESET, a delay line block for receiving and delaying an inverted signal BUF_EN of the first control signal for a predetermined time period, a third inverter INV3 for inverting and outputting an output signal of the delay line block, a second NAND gate NAND2 for receiving and NAND-operating an output signal of the third inverter INV3 and the inverted signal BUF_EN of the first control signal to provide an NAND-operated signal, and a third NAND gate NAND3 for taking and NAND-operating an output signal of the second inverter INV2 and the output signal of the second NAND gate NAND2 to produce an internal reset signal TMP_RESET to control an operation of the signal delay circuit 242.

The power down mode controller 220 includes a NAND gate NAND4 for receiving and NAND-operating an inverted signal CKEB_COM of the clock enable signal CKE, power-down mode information SAPD of mode register setting (MSR) and precharge information RASIDLE to provide a NAND-operated signal, and an inverter INV4 for inverting the output signal BUF_EN of the NAND gate NAND4 to output the first control signal BUF_ENB.

Description of the flow of signals of the control unit 200 is as follows. At the power-down mode controller 220, when the clock enable signal CKE has a second logic value, its inverted signal CKEB_COM and the power-down mode information of MRS are of a first logic value, respectively. When the precharge information RASIDLE has a first logic value, the first control signal BUF_ENB of a first logic value is output.

The signal delay circuit 242 is not reset but can operate when the inverted signal BUF_EN of the first control signal and the reset signal RESET of the reset circuit 246 have a second logic value, respectively.

At the signal delay circuit 242, although the first control signal BUF_ENB of first logic value is applied to the data input of the D F/F, the first control signal BUF_ENB is delayed until the second clock PULSE8_11 applied to the clock input of the D F/F changes from the second logic value to the first logic value, thus securing a sufficient time to do the phase update.

If the phase update is completed, then the locking information of the DLL circuit is formed and at the same time the second clock PULSE8_11 transitions to the first logic value. If the second clock PULSE8_11 assumes the first logic value, the first control signal BUF_ENB, which is being delayed by the D F/F, is provided as the output signal BUF_ENB8_11 of the signal delay circuit 242. Then, the logic circuit 244 receives the output signal BUF_ENB8_11 of the signal delay circuit 242 and the first control signal BUF_ENB and outputs the second control signal CLKBUF_ENB of the first logic value. In response to the second control signal CLKBUF_ENB of the first logic value, the operation of the clock buffer 310 turns off. Thus the internal clock of the DLL circuit turns off, and the DLL circuit enters the power-down mode.

Figure 4:
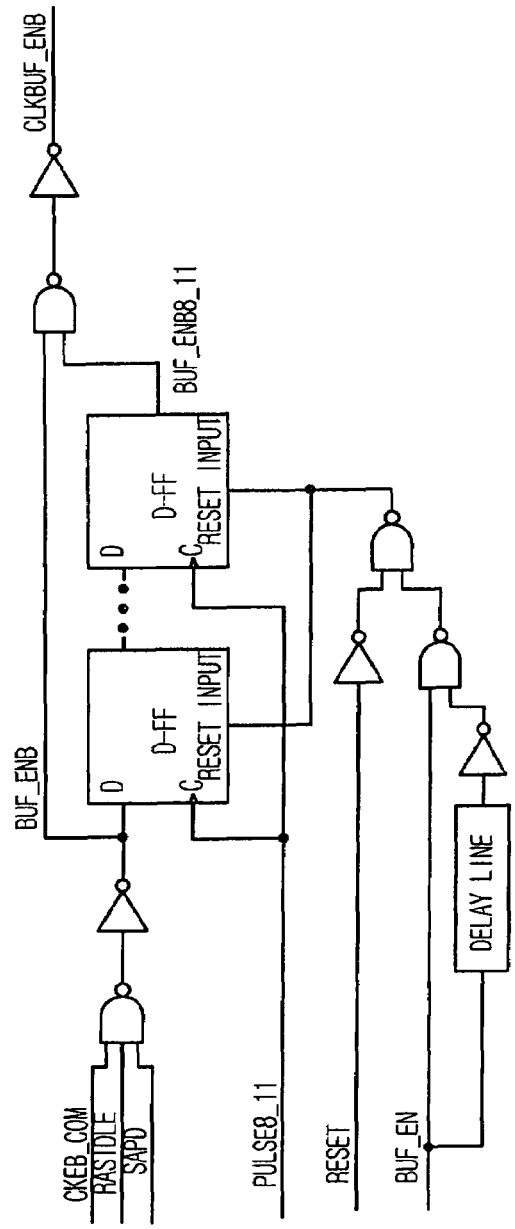
FIG. 4 is a circuit diagram for describing another embodiment of the power-down mode controller and the clock buffer controller of the present invention.

FIG. 4 is a circuit diagram for describing another embodiment of the clock buffer controller 240 of the present invention.

With reference to FIG. 4, the present invention allows the signal BUF_ENB_11 issued from the final output stage of the signal delay circuit to assume the first logic value after the second clock PULSE8_11 is issued n times (n being a natural number greater than 1) since the clock enable signal CKE assumes the second logic value. By doing so, the present invention can compensate the phase update n times by causing the second control signal CLKBUF_ENB to have the first logic value. Thus the clock buffer of the DLL circuit will be off after performing the phase update n times.

The above described invention avoids phase update with wrong information caused by time difference of the internal clock signal REFCLK and the feedback signal FBCLK that are input to the phase comparator for the reason that the clock buffer of the DLL circuit is on. The phase update is performed with the current information immediately after an ongoing phase update is completed when the clock buffer is turned off when it enters the power-down mode.

It should be noted that the logic gates and transistors illustrated in the embodiment may be implemented differently in type and location based on polarities of signals applied thereto.

The present application contains subject matter related to Korean patent application No. 2005-91555 & 2005-117124, filed in the Korean Patent Office on Sep. 29, 2005 & Dec. 2, 2005, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A synchronous memory device having a normal mode and a power-down mode, comprising:
   a DLL for performing a phase update operation during the normal mode by generating a DLL clock;
   a clock generator for producing clocks indicating a start timing and an end timing of the phase update operation during the normal mode; and
   a control unit for controlling the DLL, prior to entering the power-down mode, to terminate the phase update operation of the DLL after inputting the clock indicating the end timing of the phase update operation is inputted, thereby obtaining a margin for the phase update operation.

2. The synchronous memory device as recited in claim 1, wherein the DLL is provided with a clock buffer that buffers an external clock and generates an internal clock, and the phase update is conducted based on the internal clock.

3. The synchronous memory device as recited in claim 2, wherein the control unit controls on/off operations of the clock buffer.

4. A DLL circuit, comprising:
   a power-down mode controller for generating a first control signal to determine whether the DLL circuit enters or leaves a power-down mode;
   a clock generator for producing a first clock indicating a start of a phase update period and a second clock indicating an end of the phase update period;
   a clock buffer controller for receiving the first control signal and the second clock, and generating a second control signal in response to toggling of the second clock;
   a clock buffer for buffering an external clock and generating an internal clock in response to the second control signal; and
   a phase update circuit for performing the phase update, prior to entering the power-down mode, based on the internal clock.

5. The DLL circuit as recited in claim 4, further comprising a DLL controller for providing a reset signal to control an operation of the DLL circuit in response to a DLL reset signal and an external DLL inactivation signal.

6. The DLL circuit as recited in claim 5, wherein the clock buffer controller is reset in response to the reset signal.

7. The DLL circuit as recited in claim 6, wherein the clock buffer controller includes:
   a signal delay circuit for receiving and delaying the first control signal by a predetermined time period in response to toggling of the second clock;
   a logic circuit for generating the second control signal by using an output signal of the signal delay circuit and the first control signal; and
   a reset circuit for controlling an operation of the signal delay circuit based on the reset signal and an inverted signal of the first control signal.

8. The DLL circuit as recited in claim 7, wherein the signal delay circuit is provided with a D Flip/Flop (F/F) circuit in which the first control signal is input to a data input, the second clock to a clock input, and an output signal of the reset circuit to a reset input.

9. The DLL circuit as recited in claim 8, wherein the D F/F circuit is composed of a plurality of D F/Fs connected in serial.

10. The DLL circuit as recited in claim 7, wherein the logic circuit includes:
    a first NAND gate for receiving and NAND-operating the output signal of the signal delay circuit and the first control signal; and
    a first inverter for inverting an output signal of the first NAND gate to provide the second control signal.

11. The DLL circuit as recited in claim 10, wherein the reset circuit includes:
    a second inverter for inverting and outputting the reset signal;
    a delay line for receiving and delaying the inverted signal of the first control signal for a predetermined time period;
    a third inverter for inverting and outputting an output signal of the delay line;
    a second NAND gate for taking and NAND-operating an output signal of the third inverter and the inverted signal of the first control signal; and
    a third NAND gate for accepting and NAND-operating an output signal of the second inverter and an output signal of the second NAND gate to provide an internal reset signal to control the operation of the signal delay circuit.

12. The DLL circuit as recited in claim 11, wherein the power-down mode controller includes:
    a fourth NAND gate for receiving and NAND-operating an inverted signal of a clock enable signal, power-down mode information of mode register setting and precharge information to provide a NAND-operated signal; and
    a fourth inverter for inverting an output signal of the fourth NAND gate to provide the first control signal.

13. The DLL circuit as recited in claim 4, wherein the phase update circuit includes:
    a phase delay circuit for delaying a phase of the internal clock signal to output a delayed internal clock;

a duty cycle correction unit for correcting a duty cycle in response to locking information generated when entering into the power-down mode;

a delay replica modeling circuit for modeling the output signal of the phase delay circuit in delay factors of the clock signal within a memory to output a modeled signal as a feedback clock signal;

a phase comparator for receiving the internal clock signal and the feedback clock signal and detecting a phase difference between the two signals;

a mode generator for generating a phase update mode in response to an output signal of the phase comparator; and a delay controller for determining a degree of the phase delay of the phase delay circuit in response to the output signal of the mode generator.

* * * * *